(12) United States Patent
Yasui

(10) Patent No.: US 10,082,442 B2
(45) Date of Patent: Sep. 25, 2018

(54) FAILURE DETECTION MECHANISM FOR ELECTRIC ACTUATOR, AND ELECTRIC ACTUATOR HAVING THE SAME

(71) Applicant: NABTESCO CORPORATION, Tokyo (JP)

(72) Inventor: Tsutomu Yasui, Gifu (JP)

(73) Assignee: NABTESCO CORPORATION, Tokyo (JP)

( * ) Notice: Subject to any disclaimer, the term of this patent is extended or adjusted under 35 U.S.C. 154(b) by 353 days.

(21) Appl. No.: 15/012,480

(22) Filed: Feb. 1, 2016

(65) Prior Publication Data

US 2016/0223430 A1 Aug. 4, 2016

(30) Foreign Application Priority Data

Feb. 3, 2015 (JP) .................. 2015-019344

(51) Int. Cl.
| | | |
|---|---|---|
| *F16H 1/46* | (2006.01) | |
| *G01M 13/02* | (2006.01) | |
| *G01R 19/00* | (2006.01) | |
| *G01R 31/00* | (2006.01) | |

(52) U.S. Cl.
CPC ............ *G01M 13/021* (2013.01); *F16H 1/46* (2013.01); *G01M 13/02* (2013.01); *G01R 19/0092* (2013.01); *G01R 31/008* (2013.01)

(58) Field of Classification Search
CPC .... F16H 1/46; G01M 13/021; G01R 19/0092; G01R 31/008
See application file for complete search history.

(56) References Cited

U.S. PATENT DOCUMENTS

| 4,578,993 A | 4/1986 | Burandt |
| 5,113,704 A | 5/1992 | Yano et al. |
| 2007/0131476 A1* | 6/2007 | Kubokawa ............. B62D 1/163 180/444 |

(Continued)

FOREIGN PATENT DOCUMENTS

WO  WO 2008/112363 A2  9/2008

OTHER PUBLICATIONS

Extended European Search Report as issued in European Patent Application No. 16153795.6, dated Jun. 1, 2016.

*Primary Examiner* — Edwin A Young
(74) *Attorney, Agent, or Firm* — Pillsbury Winthrop Shaw Pittman, LLP

(57) ABSTRACT

A failure detection mechanism for an electric actuator and/or an electric actuator includes: a first gear mechanism connected to a first motor; a second gear mechanism connected to a second motor; an output section capable of rotating at a speed produced by adding together a rotation speed based on the first gear mechanism and a rotation speed based on the second gear mechanism; a first sensor configured to sense a value of electric current driving the first motor or a value associated with the value of the electric current; a second sensor configured to sense a value of electric current driving the second motor or a value associated with the value of the electric current; and a comparison unit configured to determine a failure based on a result of comparison between a first sensing value from the first sensor and a second sensing value from the second sensor.

10 Claims, 10 Drawing Sheets

(56) References Cited

U.S. PATENT DOCUMENTS

2014/0201571 A1* 7/2014 Hosek ................ G06F 11/2257
                                                    714/26
2015/0294689 A1* 10/2015 Leung .................... G11B 27/36
                                                    702/35

* cited by examiner

FAILURE DETECTION MECHANISM FOR ELECTRIC ACTUATOR, AND ELECTRIC ACTUATOR HAVING THE SAME

CROSS-REFERENCE TO RELATED APPLICATIONS

This application is based on and claims the benefit of priority from Japanese Patent Application Serial No. 2015-019344 (filed on Feb. 3, 2015), the contents of which are hereby incorporated by reference in their entirety.

TECHNICAL FIELD

The present invention relates to a failure detection mechanism for an electric actuator having a planetary gear mechanism, and an electric actuator having a failure detection mechanism for an electric actuator.

BACKGROUND

Electric actuators have conventionally been used for various devices. For example, in the field of aircrafts, there is technical tendency of electrifying actuators in accordance with electrification of aircrafts. For example, electric actuators including a jack screw have been known. As another example, U.S. Pat. No. 4,578,993 discloses an electric actuator having a planetary gear mechanism, which is hereby incorporated by reference.

In an electric actuator having a jack screw, it is difficult to distinguish a sticking state (failure state), which may be caused by sticking of a foreign matter between a screw and a gear or seizure of a gear, from a state where an electric actuator cannot be extended due to equality between an external load and an output. Therefore, even if the electric actuator is normal, when the actuator is continuously unable to be extended due to an external load, the superior system may erroneously detect a failure of the electric actuator.

The electric actuator disclosed in U.S. Pat. No. 4,578,993 includes a set of planetary gears, another set of planetary gears, and a ball ramp detection device for detecting damage on the planetary gears. However, the ball ramp detection device disclosed in U.S. Pat. No. 4,578,993 cannot detect which of the multiple sets of planetary gears has been damaged.

SUMMARY

One object of the present invention is to provide a technique of detecting which of multiple gear mechanisms included in an electric actuator has a failure due to sticking, etc.

A failure detection mechanism for an electric actuator according to the present invention comprises: a first motor; a first gear mechanism connected to the first motor; a second motor; a second gear mechanism connected to the second motor; an output section capable of rotating at a speed produced by adding together a rotation speed based on the first gear mechanism and a rotation speed based on the second gear mechanism; a first sensor configured to sense a value of electric current driving the first motor or a value associated with the value of the electric current; a second sensor configured to sense a value of electric current driving the second motor or a value associated with the value of the electric current; and a comparator configured to determine a failure based on a result of comparison between a first sensing value from the first sensor and a second sensing value from the second sensor.

The failure detection mechanism of the present invention can detect which of multiple gear mechanisms included in the electric actuator has a failure due to sticking, etc.

Objects, features, and advantages of the above technique will become apparent from the following detailed description and the accompanying drawings.

DESCRIPTION OF EXAMPLE EMBODIMENTS (Failure Detection Mechanism)

Figure 1:
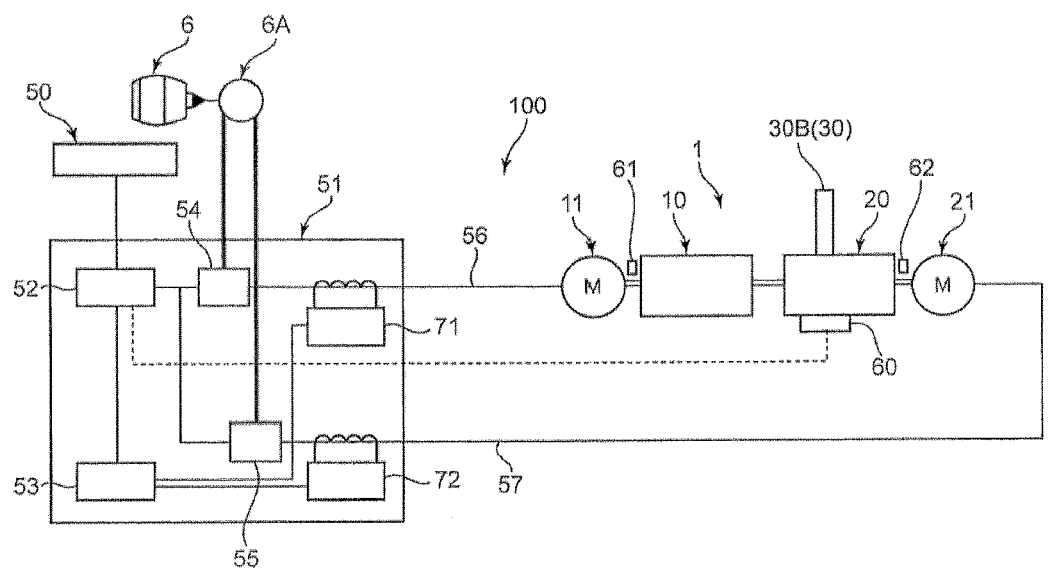
FIG. 1 is a schematic diagram showing a failure detection mechanism of an exemplary electric actuator.
Figure 2:
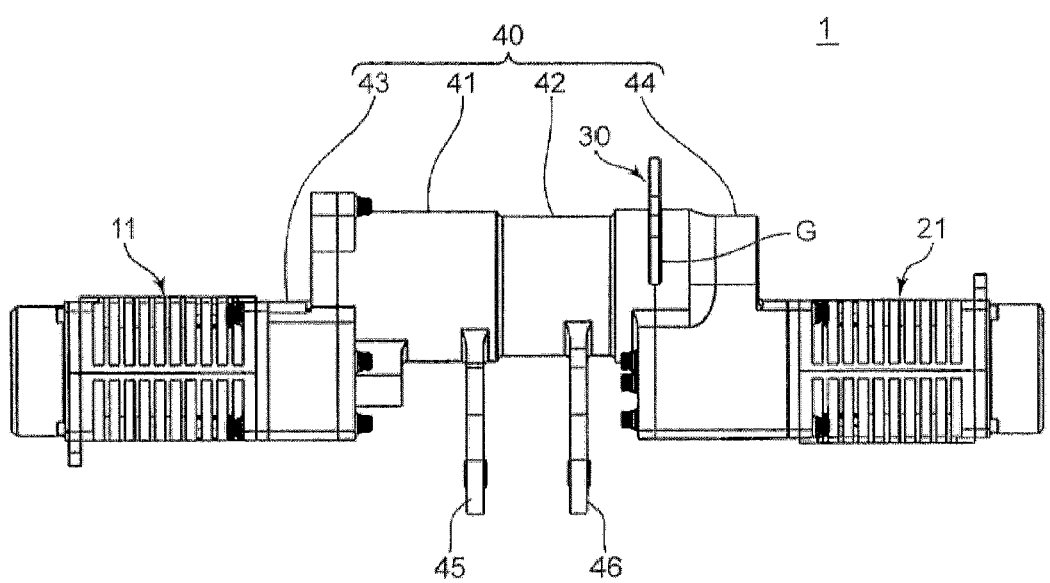
FIG. 2 is a front view of the exemplary electric actuator.

A failure detection mechanism 100 of an exemplary electric actuator 1 will now be described with reference to the drawings. As shown in FIG. 1, the failure detection mechanism 100 of this embodiment may include an electric actuator 1 and a controller 51 for controlling operation of the electric actuator 1. As shown in FIGS. 1 and 2, the electric actuator 1 may include a first motor 11, a second motor 21, a first planetary gear mechanism 10 (a first gear mechanism) connected to the first motor 11, a second planetary gear mechanism 20 (a second gear mechanism) connected to the second motor 21, an output section 30, and a case 40 (see FIG. 2).

The failure detection mechanism 100 of this embodiment can determine whether the electric actuator 1 is in a failure state or whether the electric actuator 1 is not operating due to equality between the external load and the output. The sticking (jamming) occurring in the planetary gear mechanism of the electric actuator 1 is an example of a failure. However, the causes of failures are not limited to sticking. For example, sticking may occur due to sticking of a foreign matter in the planetary gear mechanism or seizure in the planetary gear mechanism. However, the causes of sticking are not limited to them.

Figure 3:
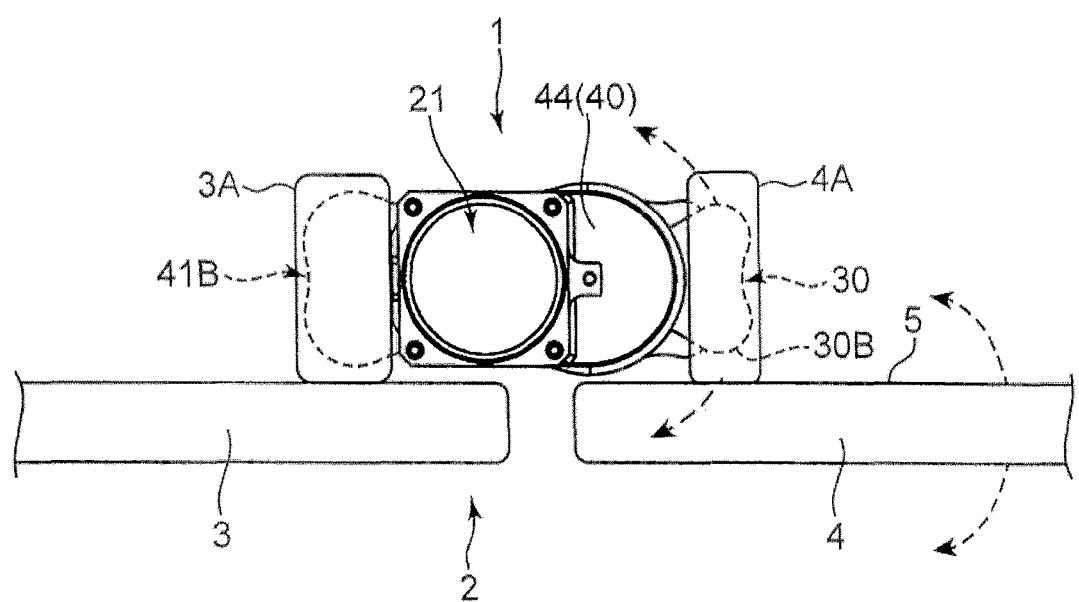
FIG. 3 is a side view of an electric actuator fixed on a device.

As shown in FIG. 3, the electric actuator 1 may be installed on an apparatus 2. The apparatus 2 may include an apparatus body 3 and an operating member 4. The electric actuator 1 can move the operating member 4 relative to the apparatus body 3. For example, a case 40 may be mounted on the apparatus body 3, while the output section 30 may be mounted on the operating member 4. When the output section 30 moves relative to the case 40, the operating member 4 may move relative to the apparatus body 3.

For this embodiment, the apparatus 2 may be an aircraft such as an airplane or a helicopter. The apparatus body 3 may be a wing body. The operating member 4 may be a control surface (moving blade). The operating member 4 may include a rudder face 5 forming at least a part of the surface of the operating member 4. When the output section 30 moves relative to the case 40, the angle of the rudder face 5 of the control surface (operating member 4) with respect to the wing body (apparatus body 3) may be changed. The operating member 4 may also be coupled to a structural portion of an airframe at a portion other than the output section 30 of the electric actuator 1.

Each of the first motor 11 and the second motor 21 may be an electric motor provided as a drive source for producing a drive force in a rotation direction under supply of electric current. One or both of the first motor 11 and the second motor 21 can reverse the rotation direction thereof (the rotation is possible in positive and reverse directions). The feedback control based on the instructions from the controller 51 may be performed on one or both of the first motor 11 and the second motor 21. Each of the motors may include a stator (not shown) and a rotor (not shown) provided in the housing.

The output section 30 can rotate at a speed produced by adding together the rotation speed based on the first planetary gear mechanism 10 and the rotation speed based on the second planetary gear mechanism 20 (a rotation speed produced by so-called speed summing).

The failure detection mechanism 100 of this embodiment may include various sensors. The controller 51 may control the electric actuator 1 based on sensing values from these sensors. The failure detection mechanism 100 may include a position sensor 60 (an angle sensor), a first speed sensor 61, a second speed sensor 62, a first sensor 71, and a second sensor 72. These sensors may be provided in any of the electric actuator 1, the controller 51, or the superior system 50.

The position sensor 60 may sense the position of the output section 30. For example, an angle sensor (a rotation angle sensor) can be suitably used as the position sensor 60. An angle sensor can sense the difference of rotation between a rotating object and a non-rotating object. For this embodiment, the angle sensor may sense, for example, the difference of rotation between the rotating output section 30 and a non-rotating object such as the case 40 (see FIG. 2). For example, sensors such as a resolver and a rotary encoder may be examples of angle sensors. Alternatively, other sensors may be used as an angle sensor. The principle of this embodiment is not limited to a particular device used as an angle sensor. The position signal (angle signal) from the position sensor 60 may be inputted into the controller 51.

The first speed sensor 61 may sense the rotation speed (the number of rotations) of the first motor 11. The second speed sensor 62 may sense the rotation speed (the number of rotations) of the second motor 12. The first speed sensor 61 may be mounted on the first motor 11. The second speed sensor 62 may be mounted on the second motor 21. The speed signals from these speed sensors may be inputted into the controller 51.

The first sensor 71 may sense the value of the current driving the first motor 11 or a value associated with the value of the current. The value associated with the value of the current driving the first motor 11 may be, for example, any value that enables calculation of the value of the current driving the first motor 11. The principle of this embodiment is not limited to a particular associated value. For example, the value of the voltage applied to the first motor 11 and the amount of strain of a shaft 11 of the first motor 11 may be examples of the associated value. For this embodiment, the first sensor 71 is an electric current sensor for measuring the value of the current driving the first motor 11. Alternatively, the first sensor 71 may be, for example, a voltage sensor for measuring the value of the voltage applied to the first motor 11. Further, the first sensor 71 may be a strain sensor provided on the shaft 11 of the first motor 11, etc., for measuring the amount of strain of that portion. The principle of this embodiment is not limited to a particular sensor device used as the first sensor 71.

The second sensor 72 may sense the value of the current driving the second motor 21 or a value associated with the value of the current. The value associated with the value of the current driving the second motor 21 may be, for example, any value that enables calculation of the value of the current driving the second motor 21. The principle of this embodiment is not limited to a particular associated value. For example, the value of the voltage applied to the second motor 21 and the amount of strain of a shaft 21 of the second motor 21 may be examples of the associated value. For this embodiment, the second sensor 72 is an electric current sensor for measuring the value of the current driving the second motor 21. Alternatively, the second sensor 72 may be, for example, a voltage sensor for measuring the value of the voltage applied to the second motor 21. Further, the second sensor 72 may be a strain sensor provided on the shaft 21 of the second motor 21, etc., for measuring the amount of strain of that portion. The principle of this embodiment is not limited to a particular sensor device used as the second sensor 72.

The first sensor 71 shown in FIG. 1 may sense the value of the current passing through the drive wire 56 connecting the first motor 11 and the first driver 54. The second sensor 72 may sense the value of the current passing through the drive wire 57 connecting the second motor 21 and the second driver 55. The first sensing value and the second sensing value sensed by these sensors may be inputted into the comparison unit 53, which is known in the art by the general structural term comparator. The first motor 11 may receive voltage from the power source via the drive wire 56. The second motor 21 may receive voltage from the power source via the drive wire 57.

As shown in FIG. 1, the controller 51 may include an operation unit (computing unit) 52, a comparison unit (comparator) 53, a first driver 54, a second driver 55, and a feedback loop. For example, the feedback loop may use the difference between the value sensed by the position sensor 60 (see FIG. 9, an angle sensor) and the value ordered by the superior system 50. The controller 51 may control the rotation of the first motor 11 and the second motor 21 based on the signals inputted from the superior system 50 and various sensors. For this embodiment, the first sensor 71 and the second sensor 72 may be provided in the controller 51. Alternatively, the first sensor 71 and the second sensor 72 may be provided in other portions. The principle of this embodiment is not limited to particular locations of the first sensor 71 and the second sensor 72.

Each of the controller 51 and the superior system 50 may include a central processing unit (CPU), a memory, an interface, etc. For example, when the CPU performs programs stored on the memory, the functions of the operation unit 52, the comparison unit 53, the first driver 54, and the second driver 55 may be implemented.

The controller 51 may be provided on the electric actuator 1. The controller 51 may be provided on a superior 50 such as an aircraft. For example, the control system provided on the apparatus 2 shown in FIG. 3 may be an example of the superior system 50. Alternatively, other control systems may be used as a superior system 50. The superior system 50 shown in FIGS. 1 and 7 may be a flight control system (FCS).

The operation unit 52 may include a feedback circuit. The feedback circuit may compare the sensed rotation angle of the output section 30 inputted from the position sensor 60 with the ordered angle of the output section 30 sent from the superior system 50, and issues an order for a rotation speed of the first motor 11 to the first driver 54 and also an order for a rotation speed of the second motor 21 to the second driver 55. The relative position of the output section 30 relative to the case 40 may be controlled by the feedback circuit of the operation unit 52.

Each of the first driver 54 and the second drive 55 may control the number of rotations of the motor with the voltage applied from the power source to the motor based on the order from the operation unit 52. As a result, each of the first driver 54 and the second driver 55 can control the operation of the electric actuator 1.

The first driver 54 may control the voltage applied to the first motor 11 based on the rotation speed ordered from the operation unit 52. The first driver 54 may include a feedback circuit for controlling the first motor 11 based on the difference between the speed signal (rotations signal) sensed by the first speed sensor 61 and the rotation speed ordered from the operation unit 52. The number of rotations of the first motor 11 may be controlled by the feedback circuit of the first driver 54.

The second driver 55 may control the voltage applied to the second motor 21 based on the rotation speed ordered from the operation unit 52. The second driver 55 may include a feedback circuit for controlling the second motor 21 based on the difference between the speed signal (rotations signal) sensed by the second speed sensor 62 and the rotation speed ordered from the operation unit 52. The number of rotations of the second motor 21 may be controlled by the feedback circuit of the second driver 55.

The first driver 54 and the second driver 55 may drive the first motor 11 and the second motor 21, respectively, using the power from the power source. Various devices may be used as the drive source. The principle of this embodiment is not limited to a particular device used as the drive source. For the example shown in FIG. 1, a power generator 6A using an engine 6 may be used as a power source. For example, an auxiliary power source such as a power generator other than the power generator 6A using the engine 6 may be used.

The comparison unit 53 (i.e., a comparator) may be provided to determine a failure of the electric actuator 1. The first sensing value (a current signal in this embodiment) from the first sensor 71 and the second sensing value (a current signal in this embodiment) from the second sensor 72 may be inputted into the comparison unit 53. The comparison unit 53 may determine whether the electric actuator 1 has a failure based on the first sensing value and the second sensing value. When the comparison unit 53 determines that one of the planetary gear mechanisms is in a failure state, the comparison unit 53 may send a failure signal to the operation unit 52. The operation unit 52 may send a failure signal timely to the superior system 50.

(Control Examples of Failure Detection Mechanism)

Exemplary control of the failure detection mechanism 100 according to this embodiment will now be described. The principle of the failure detection mechanism 100 is not limited to the following examples.

Control Example 1

Figure 4:
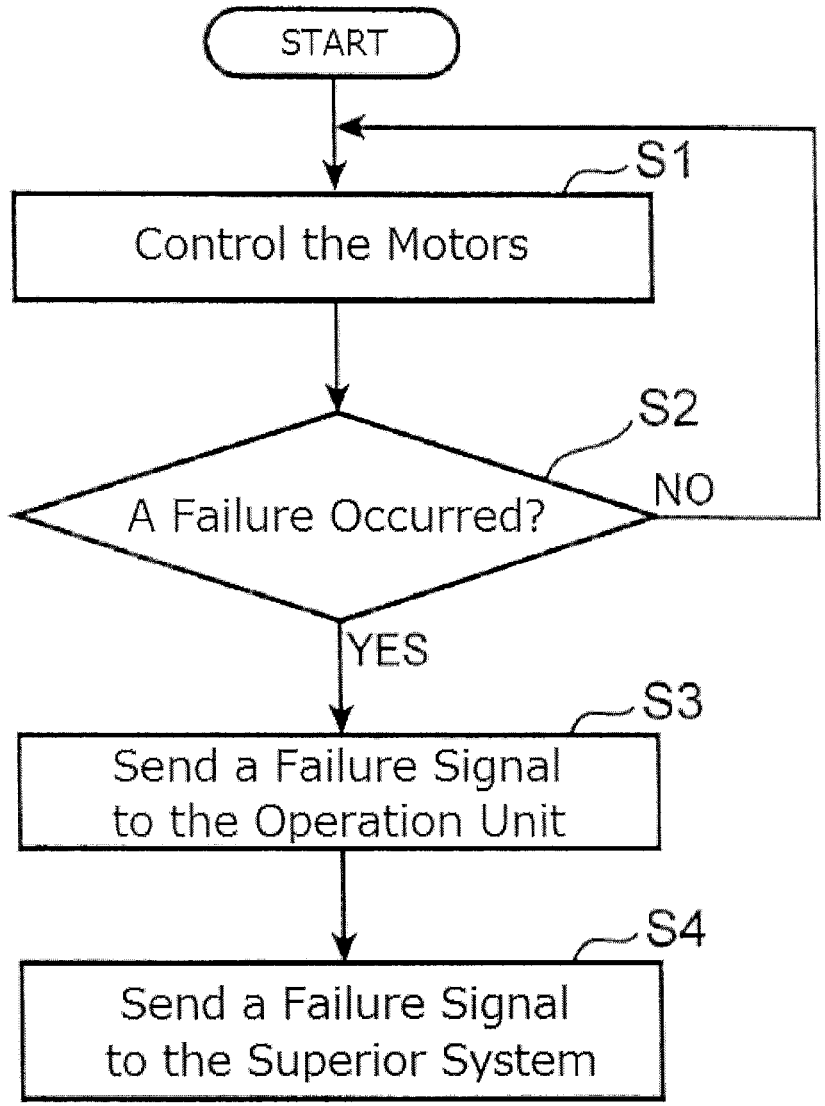
FIG. 4 is a flow chart showing Control Example 1 of the failure detection mechanism of the exemplary electric actuator.

FIG. 4 is a flow chart showing Control Example 1 of the failure detection mechanism 100 according to this embodiment. For Control Example 1, the comparison unit 53 may detect a failure based on the result of comparison between the first sensing value from the first sensor 71 and the second sensing value from the second sensor 72.

In Control Example 1 shown in FIG. 4, during normal operation in which no sticking occurs in any of the planetary gear mechanisms, the controller 51 may control the first motor 11 and the second motor 21 via the first driver 54 and the second driver 55 based on the signals inputted from the superior system 50 and the various sensors (step S1).

Next, the comparison unit 53 of the controller 51 may compare the first sensing value from the first sensor 71 and the second sensing value from the second sensor 72. The comparison unit 53 may determine whether any of the planetary gear mechanisms has a failure such as sticking based on the comparison result (step S2). In step S2, the comparison unit 53 can determine a failure as follows.

During normal operation in which no sticking occurs in any of the planetary gear mechanisms of the electric actuator 1, the ratio of two electric current values (that is, the ratio of the first sensing value from the first sensor 71 and the second sensing value from the second sensor 72) may be determined substantially uniquely with the first planetary gear mechanism 10 and the second planetary gear mechanism 20. More specifically, when no sticking occurs in the first planetary gear mechanism 10, the first planetary gear mechanism 10 may have a substantially constant sliding resistance. In this case, since the value of the electric current for driving the first motor 11 is substantially constant, the value of the electric current sensed by the first sensor 71 (the first sensing value) may also be substantially constant. Therefore, when no sticking occurs in the first planetary gear mechanism 10, the first sensing value may be substantially constant in accordance with the sliding resistance of the first planetary gear mechanism 10. Similarly, when no sticking occurs in the second planetary gear mechanism 20, the second sensing value may be substantially constant in accordance with the sliding resistance of the second planetary gear mechanism 20. Accordingly, during normal operation in which no sticking occurs in any of the first planetary gear mechanism 10 and the second planetary gear mechanism 20, the ratio of the first sensing value and the second sensing value may be substantially constant in accordance with the sliding resistance of the first planetary gear mechanism 10 and the sliding resistance of the second planetary gear mechanism 20. The ratio of the first sensing value and the second sensing value may fluctuate slightly in accordance with the efficiency of the gears and the bearings. However, when the first planetary gear mechanism 10 and the second planetary gear mechanism 20 are both in normal operation, the ratio of the first sensing value and the second sensing value may be almost determined with the reduction ratio of the first planetary gear mechanism 10 and the reduction ratio of the second planetary gear mechanism 20 and fall within a predetermined range.

When a failure such as sticking occurs in any one of the first planetary gear mechanism 10 and the second planetary gear mechanism 20, the actual rotation speed is reduced. Therefore, there is produced a difference between the actual rotation speed and the rotation speed ordered from the operation unit 52 of the planetary gear mechanism in a failure state. Accordingly, the first driver 54 or the second driver 55 raise the voltage applied to the motor corresponding to the planetary gear mechanism in a failure state for higher rotation speed. Raised voltage increases the electric current value consequently. For the planetary gear mechanism in a normal state, the motor controlled by the corresponding driver may operate at the rotation speed ordered from the operation unit 52, and there is no change in the electric current value of the sensing value. As a result, there is produced a difference between the ratio of the two sensing values (electric current values) in a failure state and the ratio of the two sensing values (electric current values) in a normal state.

Therefore, when the comparison unit 53 compares the first sensing value and the second sensing value to obtain a comparison result outside the determination criterion, the comparison unit 53 can determine that the electric actuator 1 is in a failure state.

As described above, in step S2, the comparison unit 53 may use the ratio of the two electric current values (the ratio of the first sensing value and the second sensing value) may be used to determine whether there is a failure based on the result of the comparison between the first sensing value and the second sensing value. Alternatively, the comparison unit 53 may use other determination methods in step S2. In step S2, the comparison unit 53 may use the difference between two electric current values (the difference between the first sensing value and the second sensing value) to determine whether there is a failure based on the result of the comparison between the first sensing value and the second sensing value.

For example, the suitable determination criteria may include a value or range previously set, a value or range selected each time it is required, and a value or range calculated as required. Alternatively, other determination criteria may be used. For example, the determination criteria may be set at a predetermined range that covers the ratios (or differences) between two sensing values in a normal state. The above predetermined range as a determination criterion may be previously set using a method such as an experiment or simulation such that it can be determined whether there is a failure based on the ratio (or difference) between the first sensing value and the second sensing value.

When the ratio (or difference) between the first sensing value and the second sensing value is outside the above determination criterion (that is, a normal range) ("Yes" in step S2), the comparison unit 53 may send a failure signal to the operation unit 52. The operation unit 52, having received the failure signal, may send a failure signal timely to the superior system 50 (step S4).

The superior system 50, having received the failure signal, may inform a user of the occurrence of the failure. As a result, the user becomes aware of the failure. Then, the user can take appropriate measures. For example, suitable informing methods may include displaying a failure indication on a display device visible to the user and emitting a sound via an audio device audible to the user such as a buzzer. Alternatively, other techniques for informing the user of the occurrence of the failure may be employed. The principle of this embodiment is not limited to a particular technique for informing the user of the occurrence of the failure.

When the comparison unit 53 determines in step S2 that there is no failure ("No" in step S2), the controller 51 may continue to control the motor (step S1).

Control Example 2

Figure 5:
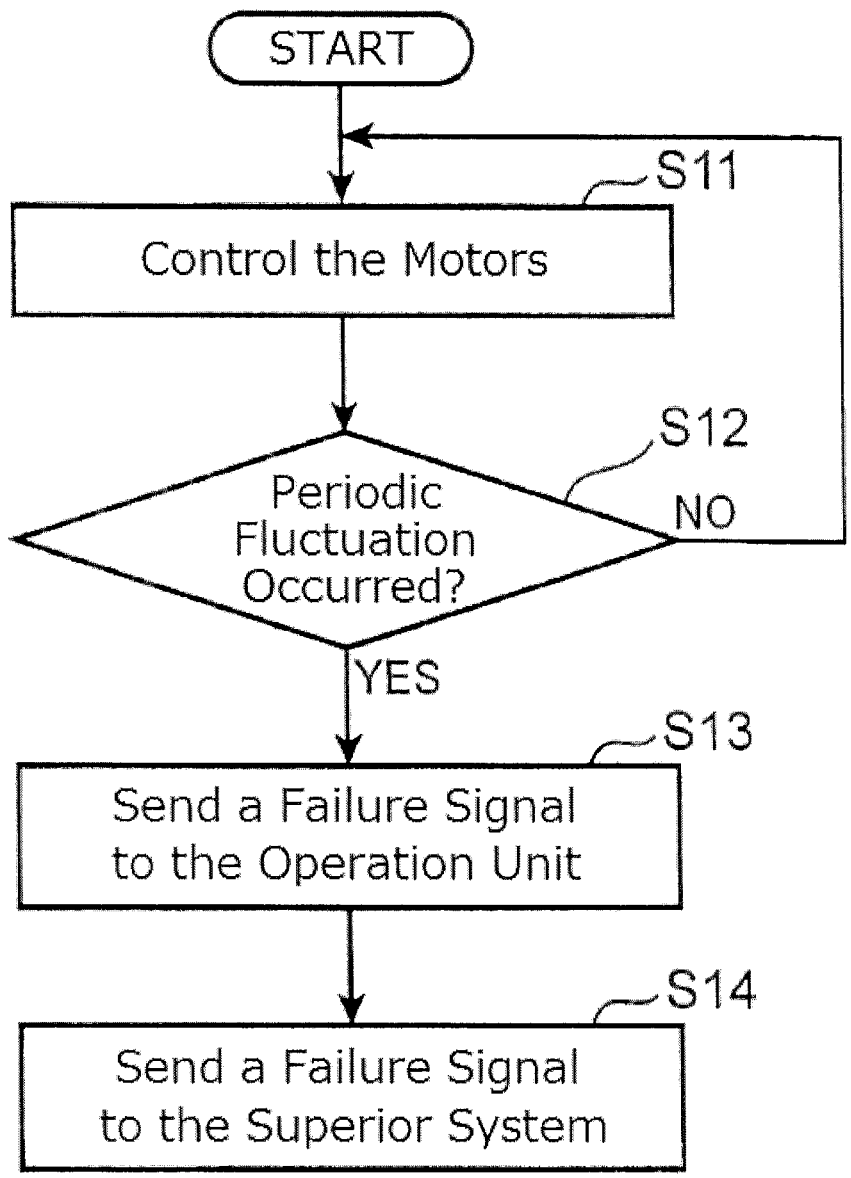
FIG. 5 is a flow chart showing Control Example 2 of the failure detection mechanism of the exemplary electric actuator.

FIG. 5 is a flow chart showing Control Example 2 of the failure detection mechanism 100 according to this embodiment. For Control Example 2, the comparison unit 53 may detect a failure based on periodic fluctuation in at least one of the first sensing value from the first sensor 71 and the second sensing value from the second sensor 72.

In Control Example 2 shown in FIG. 5, during normal operation in which no sticking occurs in any of the planetary gear mechanisms, the controller 51 may control the first motor 11 and the second motor 21 via the first driver 54 and the second driver 55 based on the signals inputted from the superior system 50 and the various sensors (step S11).

Next, the comparison unit 53 of the controller 51 may determine whether there is a periodic fluctuation in at least one of the first sensing value and the second sensing value (step S12). In step S12, the comparison unit 53 can determine a failure as follows.

In the planetary gear mechanisms 10, 20 of the electric actuator 1, part of a number of teeth in the gears (e.g., one or more teeth) may suffer fatigue or damage. When there is fatigue or damage in part of the teeth of a rotating gear, the resistance produced during rotation may be varied each time the flawed teeth mesh with adjacent gears. As a result, the electric current values (the first sensing value and the second sensing value) may also be varied each time the flawed teeth mesh with adjacent gears. That is, when there is fatigue or damage in part of the teeth in the gears of the first planetary gear mechanism 10, the first sensing value may be varied periodically. That is, when there is fatigue or damage in part of the teeth in the gears of the second planetary gear mechanism 20, the second sensing value may be varied periodically.

Accordingly, the comparison unit 53 can detect fatigue or partial damage that may occur in gears, etc. based on periodic fluctuation in at least one of the first sensing value and the second sensing value. When there is periodic fluctuation in at least one of the first sensing value and the second sensing value ("Yes" in step S12), the comparison unit 53 may send a failure signal or a maintenance request signal to the operation unit 52 (step S13). The operation unit 52, having received the failure signal, may send a failure signal or a maintenance request signal timely to the superior system 50 (step S14).

The superior system 50, having received the failure signal, may inform a user of the occurrence of the failure or the necessity of the maintenance. As a result, the user becomes aware of the occurrence of the failure or the necessity of the maintenance. Then, the user can take appropriate measures.

When the comparison unit 53 determines in step S12 that there is no failure ("No" in step S12), the controller 51 may continue to control the motor (step S11).

Control Example 3

Figure 6:
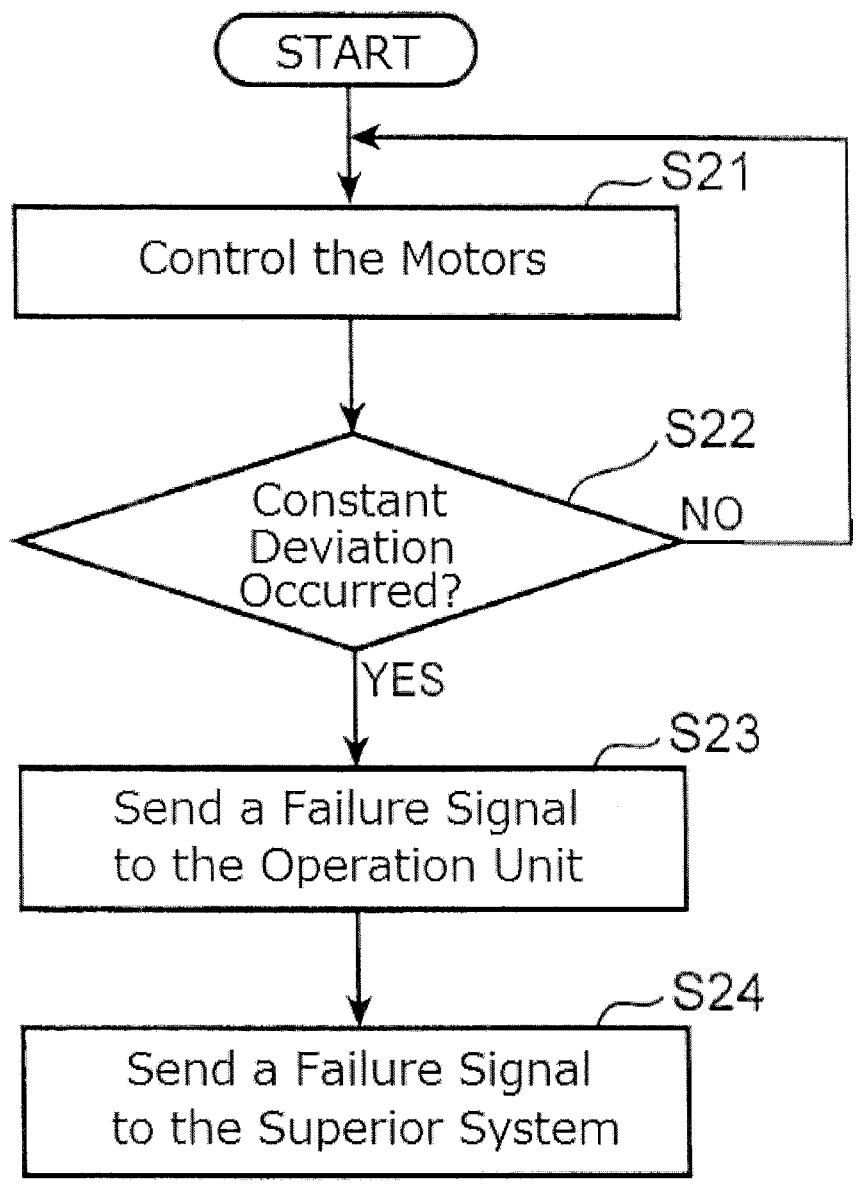
FIG. 6 is a flow chart showing Control Example 3 of the failure detection mechanism of the exemplary electric actuator.

FIG. 6 is a flow chart showing Control Example 3 of the failure detection mechanism 100 according to this embodiment. For Control Example 3, when there is constantly a deviation from a criterion in at least one of the first sensing value from the first sensor 71 and the second sensing value from the second sensor 72, the comparison unit 53 may determine that there is a failure. In Control Example 3, the comparison unit 53 can detect, for example, reduction in capacity of a motor that may occur during long-term use.

In Control Example 3 shown in FIG. 6, during normal operation in which no sticking occurs in any of the planetary gear mechanisms, the controller 51 may control the first motor 11 and the second motor 21 via the first driver 54 and the second driver 55 based on the signals inputted from the superior system 50 and the various sensors (step S21).

Next, the comparison unit 53 of the controller 51 may determine whether there is constantly a deviation from a criterion in the first sensing value and the second sensing value (step S22). In step S22, the comparison unit 53 can determine a failure as follows.

The heat produced during long-term harsh use may cause accumulated damage in magnetic circuits of the first motor 11 and the second motor 21 serving as power sources of the electric actuator 1. As a result, the first motor 11 and the second motor 21 may fail to retain the rated capacity thereof. When the capacity of the first motor 11 is reduced, there is constantly a deviation from the criterion related to the first sensing value. When the capacity of the second motor 21 is reduced, there is constantly a deviation from the criterion related to the second sensing value. Thus, the rated capacity of the motors can be an example of the criterion. Alternatively, other criteria may be used.

For example, (the initial value of) the ratio or difference between the first sensing value and the second sensing value obtained initially (before use) may be used as another criterion. That is, when the ratio or difference between the first sensing value and the second sensing value after long-term use is compared to its initial value, the comparison unit 53 can determine whether there is constantly a deviation from the initial value. Accordingly, the comparison unit 53 can appropriately determine a failure.

In Control Example 3, when there is constantly a small deviation from a criterion, the comparison unit 53 can determine that at least one of the first motor 11 and the second motor 21 is almost in a failure state. In contrast, when there is suddenly a large deviation from a criterion, the comparison unit 53 can determine that sticking or a mechanical failure has occurred, as described for Control Example 1.

Accordingly, when there is constantly a deviation from a criterion in at least one of the first sensing value and the second sensing value, the comparison unit 53 in Control Example 3 can determine that the capacity of the motor is reduced. In step S22 of Control Example 3, when there is constantly a deviation from a criterion larger than a predetermined range in at least one of the first sensing value and the second sensing value, the comparison unit 53 may determine that the capacity of the motor is reduced.

When there is constantly a deviation from a criterion in at least one of the first sensing value and the second sensing value ("Yes" in step S22), the comparison unit 53 may send a failure signal or a maintenance request signal to the operation unit 52 (step S23). The operation unit 52, having received the failure signal, may send a failure signal or a maintenance request signal timely to the superior system 50 (step S24).

The superior system 50, having received the failure signal, may inform a user of the occurrence of the failure or the necessity of the maintenance. As a result, the user becomes aware of the occurrence of the failure or the necessity of the maintenance. Then, the user can take appropriate measures.

When the comparison unit 53 determines in step S22 that there is no failure ("No" in step S22), the controller 51 may continue to control the motor (step S21).

(Detailed Structure of the Electric Actuator)

Figure 7:
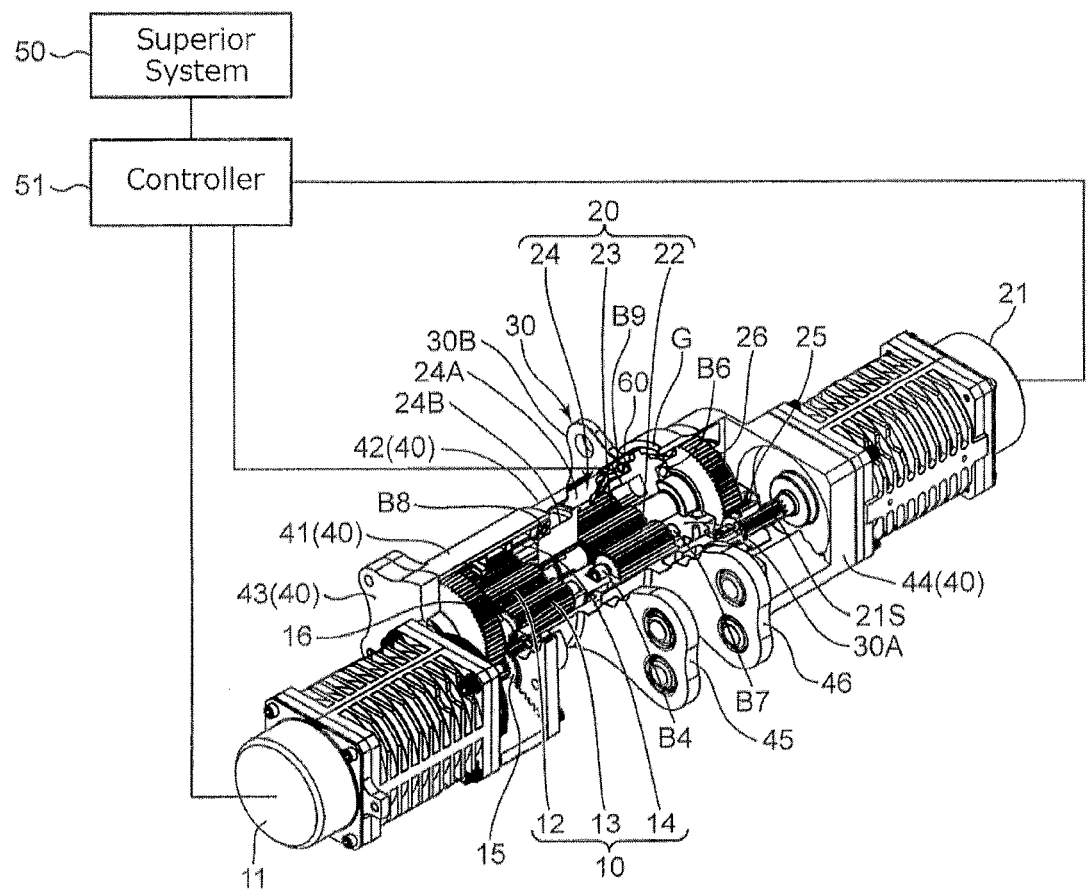
FIG. 7 is a perspective view of the exemplary electric actuator.
Figure 8:
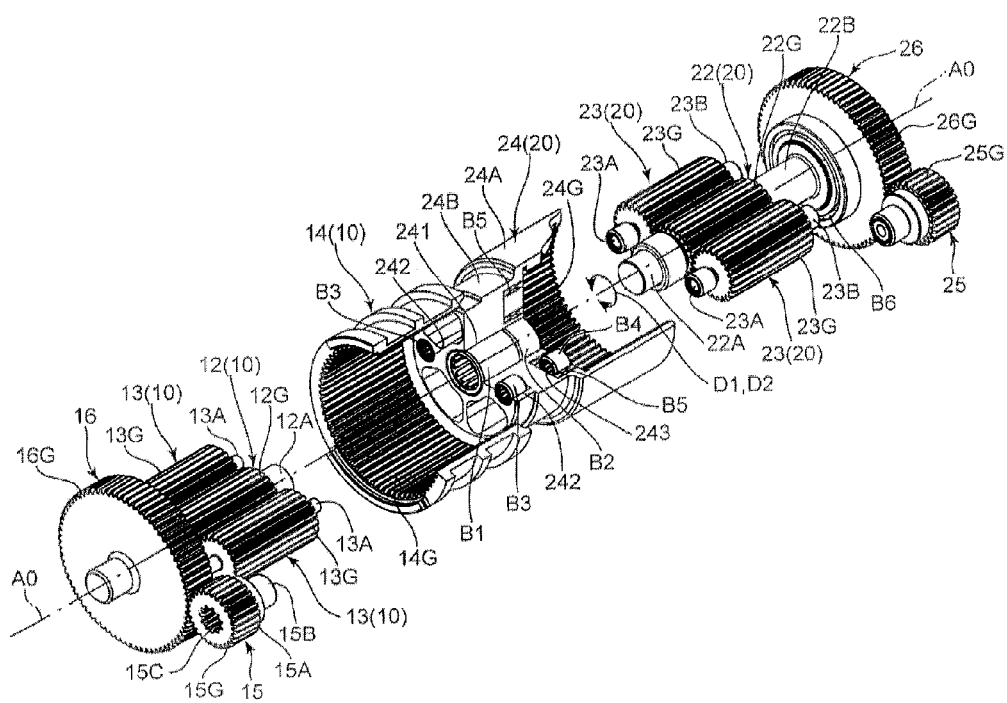
FIG. 8 is an exploded view showing the gears of the exemplary electric actuator.
Figure 9:
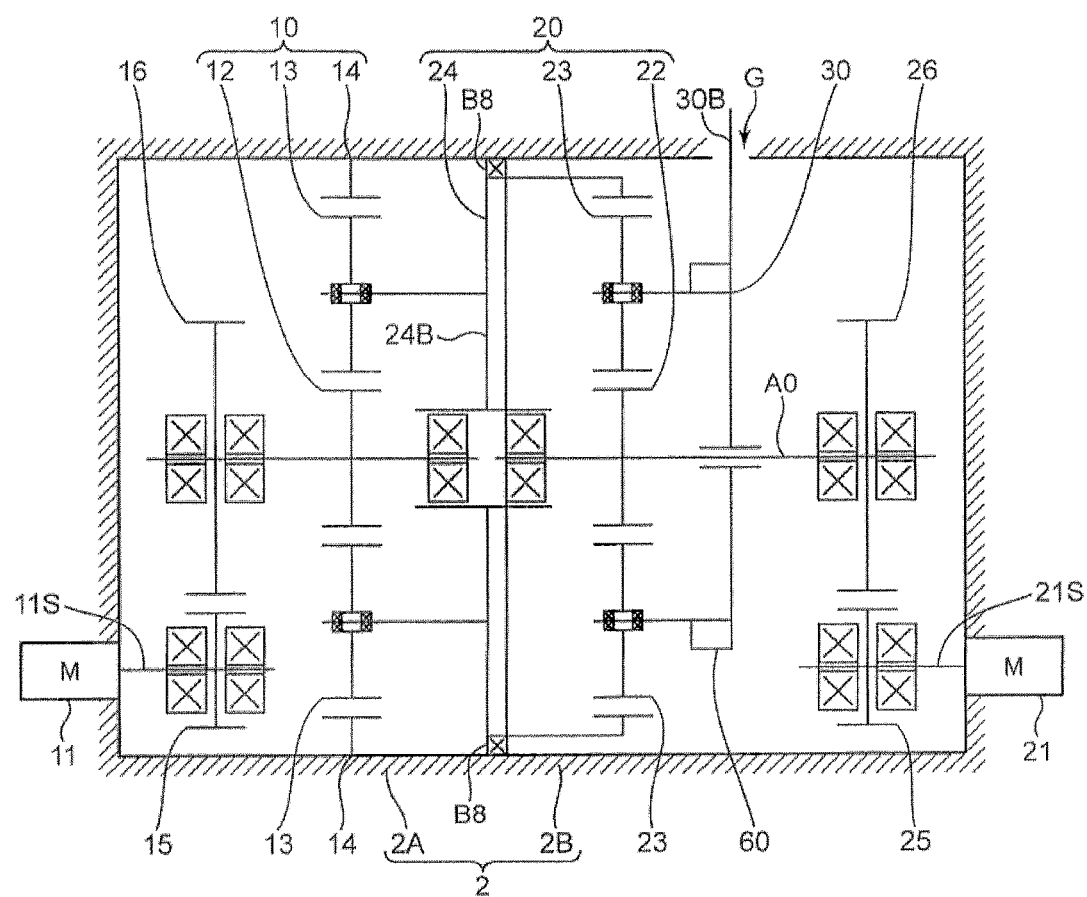
FIG. 9 is a power transmission diagram of the exemplary electric actuator.

The structure of the electric actuator 1 will now be described in detail. The electric actuator 1 used in the failure detection mechanism 100 is not limited to the following structure. FIG. 7 is a perspective view of the electric actuator 1. The case 40 shown in FIG. 7 is partially broken to show the internal structure of the electric actuator 1. FIG. 8 is an exploded view showing the structure of the gears of the electric actuator 1. FIG. 9 is a power transmission diagram of the electric actuator 1.

As stated above, the electric actuator 1 may include the second planetary gear mechanism 20 in addition to the first planetary gear mechanism 10. Therefore, the electric actuator 1 may include two power transmission routes. Even if sticking (jamming) occurs in one of the planetary gear mechanisms of the electric actuator 1, and the planetary gears are unrotatable around the axis thereof, the electric actuator 1 can rotate the output section 30 continuously with almost no time lag. Accordingly, sticking of the entirety of the electric actuator 1 is less likely to occur.

The case 40 may retain the structure wherein the first motor 11, the second motor 21, the first planetary gear mechanism 10, and the second planetary gear mechanism 20 are integrally connected with each other. In this embodiment, the case 40 may form the outer surface of the electric actuator 1.

The case 40 of this embodiment may include the first portion 41, the second portion 42, and the connection members 43, 44. The first portion 41, the second portion 42, and the connection members 43, 44 may be arranged between the first motor 11 and the second motor 21 along the axial direction of the motors. The first portion 41 and the second portion 42 may form housing spaces in which the first planetary gear mechanism 10 and the second planetary gear mechanism 20 are housed. The connection member 43 may intervene between the first motor 11 and the first portion 41 and connect the first motor 11 to the first portion 41. The connection member 44 may intervene between the second motor 21 and the second portion 42 and connect the second motor 21 to the second portion 42. In this embodiment, the first portion 41 and the second portion 42 may be formed of a single member. Alternatively, the first portion 41 may be formed of a member separate from that of the second portion 42. The connection members 43, 44 may be omitted. In such a case, the first portion 41 may be directly connected to the first motor 11, while the second portion 42 may be directly connected to the second motor 21.

The case 40 may be provided with a plurality of brackets (devises) 45, 46. The plurality of brackets (devises) 45, 46 may be used to fix the electric actuator 1 onto the apparatus body 3 of the apparatus 2. The plurality of brackets 45, 46 of this embodiment may be projected in the same direction from the side surface of the case 40. The brackets 45, 46 may have insertion holes into which sticking members (e.g., bolts) are to be inserted. For the example shown in FIG. 3, the brackets 45, 46 may be fixed on the bracket 3A provided on the apparatus body 3. The case 40 may be provided with a single bracket only.

(Planetary Gear Mechanisms)

The first planetary gear mechanism 10 may be a reduction mechanism provided on the output side of the first motor 11. The second planetary gear mechanism 20 may be a reduction mechanism provided on the output side of the second motor 21. As shown in FIGS. 7 to 9, the first planetary gear mechanism 10 may include the first sun gear 12, a plurality of first planetary gears 13, and a first internal gear 14 (a ring gear 14). The second planetary gear mechanism 20 may include the second sun gear 22, a plurality of second planetary gears 23, and a second internal gear 24 (a ring gear 24). As shown in FIGS. 8 and 9, the first sun gear 12, the second sun gear 22, the first internal gear 14, the second internal gear 24, and the output section 30 of this embodiment may be concentric and have the axis A0 (the rotation axis A0).

In this embodiment, the first planetary gear mechanism 10 may be connected to the first motor 11 via a pinion 15 and a gear wheel 16 having a larger diameter than the pinion 15. The second planetary gear mechanism 20 may be connected to the second motor 21 via a pinion 25 and a gear wheel 26 having a larger diameter than the pinion 25.

The shaft 11S (see FIG. 9) of the first motor 11 may be inserted into a though-hole 15C provided in the pinion 15. A spline may be formed on the outer side surface of the shaft 11S. A groove may be formed in the inner side surface of the through-hole 15C provided in the pinion 15. The spline may be fitted into the groove. The external teeth 15G formed in the outer side surface of the pinion 15 may mesh with the external teeth 16G formed in the external side surface of the gear wheel 16.

The shaft 21S (see FIG. 9) of the second motor 21 may be inserted into a though-hole provided in the pinion 25. A spline may be formed on the outer side surface of the shaft 21S. A groove may be formed in the inner side surface of the through-hole provided in the pinion 25. The spline may be fitted into the groove. The external teeth 25G formed in the outer side surface of the pinion 25 may mesh with the external teeth 26G formed in the external side surface of the gear wheel 26.

One end of the first sun gear 12 may be inserted through a through-hole formed at the center of the gear wheel 16, and the first sun gear 12 may be integrated with the gear wheel 16. As a result, the first sun gear 12 may be rotated in accordance with the rotation of the gear wheel 16. Therefore, the rotation of the shaft 11S of the first motor 11 may be transmitted to the pinion 15 and the gear wheel 16 and then to the first sun gear 12. That is, the first sun gear 12 may be rotated by the first motor 11.

One end of the second sun gear 22 may be inserted through a through-hole formed at the center of the gear wheel 26, and the second sun gear 22 may be integrated with the gear wheel 26. As a result, the second sun gear 22 may be rotated in accordance with the rotation of the gear wheel 26. Therefore, the rotation of the shaft 21S of the second motor 21 may be transmitted to the pinion 25 and the gear wheel 26 and then to the second sun gear 22. That is, the second sun gear 22 may be rotated by the second motor 21.

The pinion 15 and the gear wheel 16 on the first planetary gear mechanism 10 may be omitted. In such a case, the shaft 11S of the first motor 11 may be directly connected to the first sun gear 12. Similarly, the pinion 25 and the gear wheel 26 on the second planetary gear mechanism 20 may be omitted. In such a case, the shaft 21S of the second motor 21 may be directly connected to the second sun gear 22.

Each of the plurality of first planetary gears 13 may rotate on the axis thereof and revolve around the axis A0 of the first sun gear 12. In this embodiment, the first planetary gear mechanism 10 may include two first planetary gears 13. Alternatively, the first planetary gear mechanism 10 may include three or more first planetary gears 13. The external teeth 13G formed in the outer circumferential surface of each of the first planetary gears 13 may mesh with the external teeth 12G formed in the external circumferential surface of the first sun gear 12.

Each of the plurality of second planetary gears 23 may rotate on the axis thereof and revolve around the axis A0 of the second sun gear 22. In this embodiment, the second planetary gear mechanism 20 may include two second planetary gears 23. Alternatively, the second planetary gear mechanism 20 may include three or more second planetary gears 23. The external teeth 23G formed in the outer circumferential surface of each of the second planetary gears 23 may mesh with the external teeth 22G formed in the external circumferential surface of the second sun gear 22.

The first internal gear 14 shown in FIG. 8 may be located outside the plurality of planetary gears 13. In this embodiment, the first internal gear 14 may have a substantially cylindrical shape encircling the plurality of planetary gears 13, and may be open at the axially opposite ends. On the inner circumferential surface of the first internal gear 14, there may be formed internal teeth 14G that mesh with the external teeth 13G of the plurality of planetary gears 13.

The rotation of the first internal gear 14 relative to the case 40 may be restricted. In other words, the first internal gear 14 does not rotate relative to the case 40.

The first internal gear 14 may include a gear body having a cylindrical shape and a projection piece projected radially outward from the side surface of the gear body. The first portion 41 of the case 40 may have a recess formed therein for receiving the projection piece of the first internal gear 14. The recess may have an inner side surface along the shape of the projection piece. When the projection piece is received in the recess, the movement of the first internal gear 14 in the circumferential direction may be restricted. As a result, the rotation of the first internal gear 14 relative to the case 40 may be restricted.

The second internal gear 24 shown in FIG. 8 may mesh with the plurality of planetary gears 23 and rotate relative to the plurality of planetary gears 23. In this embodiment, the second internal gear 24 may include a gear body 24A and a carrier 24B.

The gear body 24A may be located outside the plurality of planetary gears 23. The gear body 24A may have a substantially cylindrical shape encircling the plurality of planetary gears 23. The gear body 24A may be open at the side opposite to the first internal gear 14. On the inner circumferential surface of the gear body 24A, there may be formed internal teeth 24G that mesh with the external teeth of the plurality of planetary gears 23.

The carrier 24B may be provided between the gear body 24A and the first internal gear 14. The carrier 24B may have a substantially cylindrical shape extending from the gear body 24A toward the first internal gear 14. The carrier 24B may transmit the revolution of the plurality of first planetary gears 13 to the gear body 24A of the second internal gear 24.

The carrier 24B may encircle one end 12A of the first sun gear 12, one end 13A of each of the first planetary gears 13, one end 22A of the second sun gear 22, and one end 23A of each of the second planetary gear 23. The carrier 24B may have a bearing seat 241, bearing seats 242, and bearing seats 243.

The bearing seat 241 may be provided on the axis A0 of the first sun gear 12 and the second sun gear 22. The bearing B1 supporting the one end 12A of the first sun gear 12 and the bearing B2 supporting the one end 22A of the second sun gear 22 may be placed on the bearing seat 241. In this embodiment, the bearing seat 241 may be formed of a member having a through-hole extending through the carrier 24B in the direction of the axis A0. Alternatively, the portion of the bearing seat 241 where the bearing B1 is placed may not communicate with the portion of the bearing seat 241 where the bearing B2 is placed.

A bearing (not shown) may be provided on the other end of the first sun gear 12 (the end of the first sun gear 12 on the gear wheel 16 side). The bearing B1 and the bearing provided on the other end of the first sun gear 12 may support the first sun gear 12 and allow the rotation thereof on the axis A0. A bearing B6 may be provided on the other end 22B of the second sun gear 22 (the end 22B of the second sun gear 22 on the gear wheel 26 side). The bearing B6 and the bearing B2 may support the second sun gear 22 and allow the rotation thereof on the axis A0.

The bearing seats 242 may be provided on the axes of the plurality of first planetary gears 13. Bearings B3, supporting the one end 13A of the corresponding first planetary gears 13 may be placed on the bearing seats 242. In this embodiment, each of the bearing seats 242 may be formed of a cavity recessed axially in the end surface of the carrier 24B on the first planetary gear 13 side. Alternatively, the bearing seats 242 may have other structure and/or shapes.

A bearing may be provided on the other end of each of the first planetary gears 13 (the end of each of the first planetary gears 13 on the gear wheel 16 side). The bearing B3 and the bearing provided on the other end of each of the first planetary gears 13 may support the first planetary gear 13 and allow the rotation thereof on its axis.

The bearings 133 may be fitted in the bearing seats 242 (cavity 242). Therefore, the movement of the bearings B3 in the circumferential direction of the carrier 24B relative to the carrier 24B may be restricted. When the plurality of first planetary gears 13 revolve around the axis A0 of the first sun gear 12, the carrier 24B may also rotate on the axis A0 in accordance with the revolution of the plurality of first planetary gears 13. The carrier 24B may be integrated with the gear body 24A. Therefore, when the carrier 24B rotates on the axis A0, the gear body 24A also rotates on the axis A0. As a result, the carrier 24B can transmit the revolution of the plurality of first planetary gears 13 to the gear body 24A of the second internal gear 24.

The bearing seats 243 may be provided on the axes of the plurality of second planetary gears 23. Bearings B4, supporting the one end 23A of the corresponding second planetary gears 23 may be placed on the bearing seats 243. In this embodiment, each of the bearing seats 243 may be formed of a cavity recessed axially in the end surface of the carrier 24B on the second planetary gear 23 side. Alternatively, the bearing seats 243 may have other structure and/or shapes.

As shown in FIG. 8, one end 23A of the each of the second planetary gears 23 (that is, the bearing B4 through which the one end 23A of the second planetary gear 23 is inserted) may be supported by the bearing B5 provided on the carrier 24B. The bearing B5 may allow the rotation of the one end 23A of each of the second planetary gears 23 relative to the carrier 24B. As a result, with the external teeth 23G of the plurality of second planetary gears 23 meshing with the external teeth 22G of the first sun gear 22 and the internal teeth 24G of the second internal gear 24, the plurality of second planetary gears 23 can revolve around the axis A0 of the first sun gear 22. The plurality of second planetary gears 23 can rotate relative to the second internal gear 24.

The other end 23B of the each of the second planetary gears 23 (the end 23B of each of the second planetary gears 23 on the gear wheel 26 side) may be supported by the bearing B7 (see FIG. 7) provided on the output section 30 (described later). The bearing B7 and the bearing B4 may support the second planetary gear 23 and allow the rotation thereof on its axis.

The electric actuator 1 may include a bearing B8 (see FIG. 7) provided between the case 40 and the second internal gear 24. The second internal gear 24 may be supported by the bearing B8. The bearing B8 may allow the rotation of the second internal gear 24 relative to the case 40. When the plurality of first planetary gears 13 revolve around the axis A0 of the first sun gear 12, the second internal gear 24 may rotate at the same rate as the plurality of first planetary gears 13.

(Output Section)

The output section 30 shown in FIG. 7 may rotate in accordance with the revolution of the plurality of second planetary gears 23 around the axis of the second sun gear 22. In the example shown in FIG. 7, the output section 30 may include a body 30A located in the case 40 and an extending portion 30B extending radially outward from the outer circumferential surface of the body 30A. A part or the entirety of the extending portion 30B may be projected outside the case 40 through the groove G provided in the case 40 (see FIG. 9). Since the groove G in the case 40 extends longer than the region of rotation of the output section 30, the case 40 does not restrict rotation of the extending portion 30B.

The body 30A of the output section 30 may be located between the second internal gear 24 and the gear wheel 26. The body 30A of this embodiment may have a substantially cylindrical shape. The body 30A may have a through-hole 31 through which the other end 22B of the second sun gear 22 may be inserted.

The bearing B9 may be provided between the output section 30 and the case 40. The bearing B9 may support the body 30A of the output section 30. The body 30A of the output section 30 can rotate relative to the case 40. In this embodiment, the bearing B9 may be a ball bearing. Alternatively, a bearing component of another type may be used as the bearing B9.

The other end 23B of each of the second planetary gears 23 may be located on the body 30A of the output section 30. The body 30A may include bearing seats 32. The bearing seats 32 may be provided on the axes of the plurality of second planetary gears 23. Bearings B7, supporting the other end 23B of the corresponding second planetary gears 23 may be placed on the bearing seats 32. In this embodiment, each of the bearing seats 32 may be formed of a cavity recessed axially in the end surface of the body 30A on the second internal gear 24 side.

As stated above, the one end 23A of each of the second planetary gears 23 may be supported by the bearing B4 provided on the carrier 24B of the second internal gear 24. The bearing B4 and the bearing B7 may support the second planetary gear 23. The second planetary gears 23 can rotate on the axes thereof.

(Operation of the Electric Actuator)

An example of the operation of the electric actuator 1 will now be described with reference to FIGS. 8 and 9.

(Normal Operation)

When the first motor 11 of the electric actuator 1 operates under the order from the controller 51, the pinion 15 fixed on the shaft 11S may rotate. Simultaneously, the gear wheel 16, which has the external teeth 16G meshing with the external teeth 15G of the pinion 15, may also rotate. When the gear wheel 16 rotates, the first sun gear 12 fixed on the gear wheel 16 may also rotate on the axis A0 thereof. Simultaneously, the plurality of first planetary gears 13, which have the external teeth 13G meshing with the external teeth 12G of the first sun gear 12, may rotate on the respective axes. The first internal gear 14 may be fixed on the case 40. Therefore, the first internal gear 14 does not rotate relative to the case 40. When the plurality of first planetary gears 13 rotate on the respective axes, the plurality of first planetary gears 13 may revolve around the axis A0 of the first sun gear 12 while meshing with the internal gear 14G of the first internal gear 14.

When the plurality of first planetary gears 13 revolve around the axis A0 of the first sun gear 12, the carrier 24B of the second internal gear 24 to which the one end of each of the plurality of first planetary gears 13 is connected may rotate on the axis A0. The carrier 24B may rotate at the same rate and in the same direction as the plurality of first planetary gears 13. Therefore, the gear body 24A of the second internal gear 24 formed integrally with the carrier 24B may also rotate on the axis A0 at the same rate and in the same direction D1.

The rotation of the second internal gear 24 on the axis A0 may cause the plurality of second planetary gears 23 having the external teeth 23G meshing with the internal teeth 24G of the second internal gear 24 to rotate in the same direction D1.

When the second motor 21 operates under the order from the controller 51, the pinion 25 fixed on the shaft 21S may rotate. As a result, the gear wheel 26 having the external teeth 26G meshing with the external teeth 25G of the pinion 25 may also rotate. When the gear wheel 26 rotates, the second sun gear 22 fixed on the gear wheel 26 may also rotate on the axis A0 thereof. The plurality of second planetary gears 23 having the external teeth 23G meshing with the external teeth 22G of the second sun gear 22 may rotate on the respective axes 23 and revolve around the axis A0 of the second sun gear 22 in the rotational direction D2, while meshing with the internal teeth 24G of the second internal gear 24.

If the rotational direction D1, in which the first motor 11 rotates the second internal gear 24, is the same as the rotational direction D2, in which the second motor 21 rotates the plurality of second planetary gears 23 on the axis A0, the rotational speed (rotational rate) by the first motor 11 and the rotational speed (rotational rate) by the second motor 21 may be added together for so-called speed summing. Such speed summing may enable the output section 30 to rotate at a higher rate than in the conventional art without speed summing. In this embodiment, the torque of rotation is not summed up by the speed summing.

If the rotational direction D1, in which the first motor 11 rotates the second internal gear 24, is counter to the rotational direction D2, in which the second motor 21 rotates the plurality of second planetary gears 23 on the axis A0, the above-mentioned speed summing does not occur. In this case, one of the first motor 11 and the second motor 21 may brake the rotation of the other.

When the position sensor 60 detects that the output section 30 has rotated to a predetermined position, the signal of the position sensor 60 may be inputted to the controller 51. The first motor 11 and the second motor 21 may stop under the order from the controller 51. As a result, the operating member 4 may be located at a desired position.

(Operation in a Failure)

The operation of the electric actuator 1 will be described in the case where one of the first planetary gears 13 and the second planetary gears 23 is unable to rotate on the axis thereof.

The external teeth 13G of the plurality of first planetary gears 13 may mesh with the internal teeth 14G of the first internal gear 14 that is restricted from rotating. Therefore, when the first planetary gears 13 are unable to rotate on the respective axes, the first planetary gears 13 cannot revolve around the axis A0 of the first sun gear 12. As a result, the first planetary gears 13 cannot cause the second internal gear 24 to rotate. On the other hand, the plurality of second planetary gears 23 can revolve around the axis A0 of the second sun gear 22. Therefore, the output section 30 can continuously rotate in accordance with the revolution of the plurality of second planetary gears 23. That is, even immediately after sticking has occurred in the first planetary gears 13, the output section 30 can rotate continuously without being hindered by the sticking in the first planetary gears 13 and with almost no time lag.

When the second planetary gears 23 are unable to rotate on the respective axes, the plurality of second planetary gears 23 cannot revolve around the axis A0 of the second sun gear 22 while rotating on the respective axes. However, the plurality of second planetary gears 23 can revolve around the axis A0 of the second sun gear 22 along with the second internal gear 24 without changing the meshing position with the external teeth 22G of the second sun gear 22 and the meshing position with the internal teeth 24G of the second internal gear 24. Therefore, the output section 30 can continuously rotate in accordance with the revolution of the plurality of second planetary gears 23. That is, even immediately after sticking has occurred in the second planetary gears 23, the output section 30 can rotate continuously without being hindered by the sticking in the second planetary gears 23 and with almost no time lag.

Summary of this Embodiment

This embodiment may include the first planetary gear mechanism 11 connected to the first motor 11 and the second planetary gear mechanism 20 connected to the second motor 21. In normal operation where there is no failure such as sticking in any of the planetary gear mechanisms, the output section 30 can rotate at a speed produced by adding together the rotation speed based on the first planetary gear mechanism 10 and the rotation speed based on the second planetary gear mechanism 20 (a rotation speed produced by so-called speed summing). Therefore, the output section 30 of this embodiment can rotate at a higher rate as compared to the electric actuators having conventional planetary gear mechanisms without speed summing.

In this embodiment, the value of the electric current driving the first motor 11 may be detected by the first sensor 71. The value of the electric current driving the second motor 21 may be detected by the second sensor 72. The comparison unit 53 may determine a failure based on the result of comparison between the first sensing value from the first sensor 71 and the second sensing value from the second sensor 72. The principle of this embodiment enables determination of whether the electric actuator 1 is in a failure state such as sticking (jamming) or whether the electric actuator 1 is not operating due to equality between the external load and the output. There is less possibility of erroneous detection. In this embodiment, the comparison unit 53 may determine a failure based on the result of comparison between the first sensing value from the first sensor 71 and the second sensing value from the second sensor 72; therefore, it can be detected which of the first planetary gear mechanism 10 and the second planetary gear mechanism 20 has the failure.

In this embodiment, the comparison unit 53 may determine a failure based on a periodic fluctuation in at least one of the first sensing value and the second sensing value. Conventional electric actuators do not have means for detecting fatigue or damage in part of the teeth. In contrast, the principle of this embodiment enables detection of fatigue or partial damage in gears under long-term use.

When there is constantly a deviation from a criterion in at least one of the first sensing value and the second sensing value, the comparison unit 53 of this embodiment may determine that there is a failure. Since conventional techniques do not provide means for detecting reduction of capacity of a motor, it was necessary to periodically detach the electric actuator for maintenance. In contrast, the principle of this embodiment enables detection of reduction in capacity of a motor under long-term use.

The first planetary gear mechanism 10 of this embodiment may include the first sun gear 12, a plurality of first planetary gears 13, and a first internal gear 14. The first sun gear 12 may be rotated by the first motor 11. The plurality of first planetary gears 13 may mesh with the first sun gear 12. The first internal gear 14 may have internal teeth 14G meshing with the first planetary gears 13. The rotation of the first internal gear 14 may be restricted. The second planetary gear mechanism 20 may include the second sun gear 22, a plurality of second planetary gears 23, and a second internal gear 24. The second sun gear 22 may be rotated by the second motor 21. The plurality of second planetary gears 23 may mesh with the second sun gear 22. The second internal gear 24 may have internal teeth 24G meshing with the second planetary gears 23. When the first planetary gears 13 revolve around the axis A0 of the first sun gear 12, the second internal gear 24 may rotate. When the second planetary gears 23 revolve around the axis A0 of the second sun gear 22, the output section 30 may rotate.

In the above-mentioned configuration, the rotation of the first internal gear 14 may be restricted. When the first planetary gears 13 meshing with the internal teeth 14G of the first internal gear 14 revolve, the second internal gear 24 may rotate. Even if sticking occurs in one of the planetary gear mechanisms and prohibits the planetary gears from rotating on the respective axes, the output section 30 can rotate continuously with almost no time lag. Accordingly, the principle of this embodiment produces a high reliability.

(Variation)

The principle of this embodiment is not limited to the above description or the illustrated structure. Those skilled in the art can make various modifications or improvements within the purport of this embodiment. In place of the first planetary gear mechanism 10 as the first gear mechanism and the second planetary gear mechanism 20 as the second gear mechanism, a planetary roller mechanism including sun rollers, planetary rollers, and internal tooth rollers can be employed. Further, as the first gear mechanism and the second gear mechanism, a gear mechanism that receives input of two drive forces and outputs one drive force may be employed.

In this embodiment, the apparatus body 3 may be a wing body of an aircraft. The operating member 4 may be a control surface (moving blade). Alternatively, the apparatus body 3 may be an airframe of an aircraft. The operating member 4 may be, for example, a door provided on an airframe and capable of opening and closing the doorway.

In this embodiment, the apparatus 2 on which the electric actuator 1 is mounted may be an aircraft. Alternatively, the electric actuator 1 may be mounted on other apparatuses 2 such as ships and ground vehicles.

The failure detection of at least one of Control Example 2 and Control Example 3 may be performed in combination with the failure detection of Control Example 1 described in connection with the failure detection mechanism 100 of the above embodiment.

Figure 10:
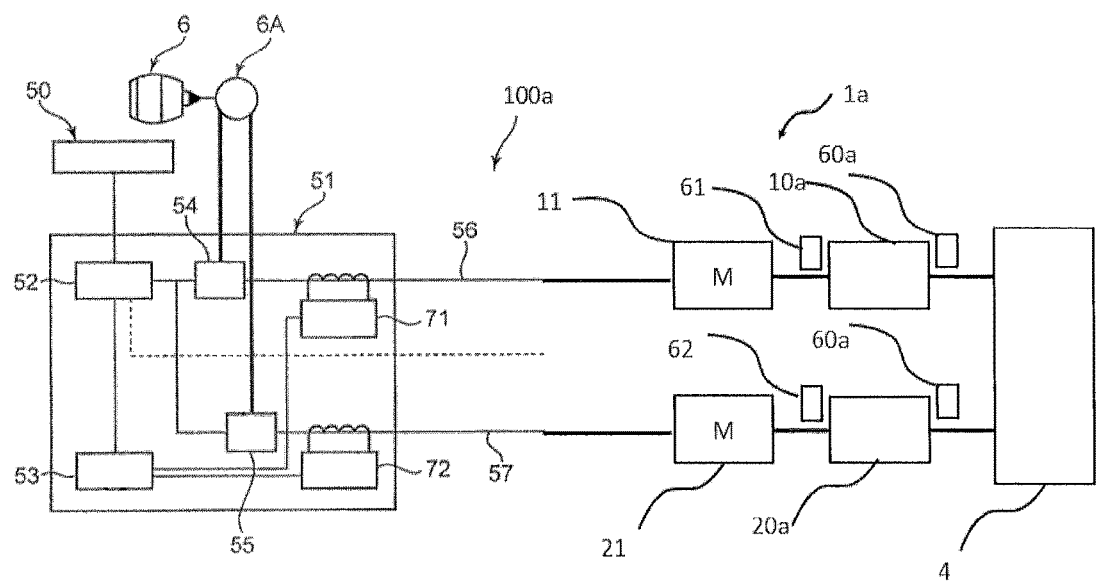
FIG. 10 is a schematic diagram of an alternate embodiment of a failure detection mechanism of an exemplary electric actuator

Further, a failure detection mechanism 100a of an exemplary electric actuator 1 will now be described with reference to FIG. 10. The failure detection mechanism 100a of this embodiment may include an electric actuator 1a and a controller 51 for controlling operation of the electric actuator 1a. As shown in FIGS. 1 and 2, the electric actuator 1a may include a first motor 11, a second motor 21, a first planetary gear mechanism 10a (a first gear mechanism) with the input thereof connected to the output of the first motor 11 and the output thereof connected to the operation member 4 (driven member), and a second planetary gear mechanism 20a (a second gear mechanism) with the input thereof connected to the output of the second motor 21 and the output thereof connected to the operation member 4 (driven member). Both the first planetary gear mechanism 10a and the second planetary gear mechanism 20a may be a direct-acting mechanism including a planetary gear (not shown) and a ball screw (not shown). Further, the planetary gear of the first planetary gear mechanism 10a and the planetary gear of the second planetary gear mechanism 20a both serve as a clutch and are separated from each other such that even when one of the first planetary gear mechanism 10a and the second planetary gear mechanism 20a is in a failure state, the other is not impacted. The planetary gears serving as clutches may be replaced with a well known means such as electromagnetic fluid or clutch plates.

The failure detection mechanism 100a of this embodiment can determine whether the electric actuator 1a is in a failure state or whether the electric actuator 1a is not operating due to equality between the external load and the output. The sticking (jamming) occurring in the planetary gear mechanism of the electric actuator 1a is an example of a failure. However, the causes of failures are not limited to sticking. For example, sticking may occur due to sticking of a foreign matter in the planetary gear mechanism or seizure in the planetary gear mechanism. However, the causes of sticking are not limited to them.

For this embodiment, the apparatus 2 may be an aircraft such as an airplane or a helicopter. The apparatus body 3 may be a wing body. The operating member 4 may be the flight control surface operating portion (moving wing). The operating member 4 may include a control surface 5 forming at least a part of the surface of the operating member 4. When the electric actuator 1a moves, the angle of the rudder face 5 of the control surface (operating member 4) with respect to the wing body (apparatus body 3) may be changed.

The position sensor 60a of this embodiment may be a stroke sensor for sensing the amount of projection of the ball screw and may be formed of, e.g., a linear velocity displacement transformer (LVDT). The elements denoted by the same reference sign as in the above embodiments are the same elements as in the above embodiments. The description of these elements will be omitted.

The rest of this embodiment is the same as in the above embodiments; and the description thereof will be omitted.

The above embodiment may include the following features.

A failure detection mechanism for an electric actuator and an electric actuator according to an aspect of the above embodiment comprise: a first motor; a first gear mechanism connected to the first motor; a second motor; a second gear mechanism connected to the second motor; an output section capable of rotating at a speed produced by adding together a rotation speed based on the first gear mechanism and a rotation speed based on the second gear mechanism; a first sensor configured to sense a value of electric current driving the first motor or a value associated with the value of the electric current; a second sensor configured to sense a value of electric current driving the second motor or a value associated with the value of the electric current; and a comparator configured to determine a failure based on a result of comparison between a first sensing value from the first sensor and a second sensing value from the second sensor.

The failure detection mechanism for an electric actuator and the electric actuator may include a first gear mechanism connected to the first motor and a second gear mechanism connected to the second motor. In normal operation where there is no failure such as sticking in any of the gear mechanisms, the output section can rotate at a speed produced by adding together the rotation speed based on the first gear mechanism and the rotation speed based on the second gear mechanism (a rotation speed produced by so-called speed summing). Therefore, in the present invention, the output section can rotate at a higher rate as compared to the electric actuators having conventional planetary gear mechanisms without speed summing.

In the failure detection mechanism for an electric actuator having speed-summing gear mechanisms and the electric actuator, the first sensor may sense the value of the electric current driving the first motor or a value associated with the electric current value. The second sensor may sense the value of the electric current driving the second motor or a value associated with the electric current value. The comparator may determine a failure based on the result of comparison between the first sensing value from the first sensor and the second sensing value from the second sensor. Therefore, the failure detection mechanism for an electric actuator can determine whether the electric actuator is in a failure state such as sticking (jamming) or whether the electric actuator is not operating due to equality between the external load and the output. The failure detection mechanism for an electric actuator is less likely to produce erroneous detection. The comparison unit may determine a failure based on the result of comparison between the first sensing value from the first sensor and the second sensing value from the second sensor; therefore, the failure detection mechanism for an electric actuator can detect which of the first gear mechanism and the second gear mechanism has the failure.

In the failure detection mechanism for an electric actuator and the electric actuator including the above speed-summing planetary gear mechanisms, during normal operation in which no sticking occurs in any of the gear mechanisms, the ratio or difference between two detection values (that is, the ratio or difference between the first sensing value from the first sensor and the second sensing value from the second sensor) may be determined substantially uniquely with the first gear mechanism and the second gear mechanism. When the first gear mechanism and the second gear mechanism are both in normal operation, the ratio or difference between the first sensing value and the second sensing value may be almost determined with the reduction ratio of the first gear mechanism and the reduction ratio of the second gear mechanism, although it may be slightly varied with the efficiency of the gears and the bearings. Therefore, the ratio or difference between the first sensing value and the second sensing value may fall within a predetermined range.

When a failure such as sticking occurs in any one of the first gear mechanism and the second gear mechanism, a difference may be produced in the gear mechanism in the failure state between the rotation speed ordered from the control means such as the controller and the actual rotation speed. Accordingly, the controller may raise the value of the electric current driving the motor corresponding to the gear mechanism in the failure state for higher rotation speed. For the planetary gear mechanism in a normal state, the corresponding motor may operate at the speed ordered from the controller. Therefore, there is produced a difference between the ratio (or difference) between the two sensing values in a failure state and the ratio (or difference) between the two sensing values in a normal state.

The comparison unit may determine whether there is a failure such as sticking based on the result of comparison between the first sensing value from the first sensor and the second sensing value from the second sensor. As a result, the failure detection mechanism for an electric actuator is less likely to produce erroneous detection. In addition, the failure detection mechanism for an electric actuator can detect which of the first gear mechanism and the second gear mechanism has a failure. The failure detection mechanism for an electric actuator can detect which of the gear mechanisms has a failure using the first motor and the second motor provided for speed summing.

In the above failure detection mechanism for an electric actuator and the electric actuator, the comparison unit may determine a failure based on a periodic fluctuation in at least one of the first sensing value and the second sensing value. Therefore, the failure detection mechanism for an electric actuator can detect fatigue or partial damage in gears under long-term use.

A part of a number of teeth in the gears (e.g., one or more teeth) may suffer fatigue or damage. When there is fatigue or damage in part of the teeth of a gear, the resistance produced during rotation may be varied each time the flawed teeth mesh with adjacent gears. Therefore, the electric current values may also be varied each time the flawed teeth mesh with adjacent gears. That is, when there is fatigue or damage in part of the teeth of a gear, at least one of the first sensing value and the second sensing value may be varied periodically. Accordingly, the comparison unit can determine that there is fatigue or partial damage in gears, etc. based on periodic fluctuation in at least one of the first sensing value and the second sensing value.

When there is constantly a deviation from a criterion in at least one of the first sensing value and the second sensing value, the comparison unit of the failure detection mechanism of the above electric actuator may determine that there is a failure. The failure detection mechanism for an electric actuator and the electric actuator can detect reduction in capacity of a motor under long-term use.

The magnetic circuit of a motor used as a drive source of the electric actuator may suffer cumulative damage due to heat produced under long-term harsh use. As a result, the motor may fail to retain the rated capacity thereof. When the capacity of the motor is reduced, there is constantly a deviation from the criterion related to at least one of the first sensing value and the second sensing value. Accordingly, when there is constantly a deviation from a criterion in at least one of the first sensing value and the second sensing value, the comparison unit can determine that the capacity of the motor is reduced.

In the failure detection mechanism for an electric actuator and the electric actuator, the first gear mechanism may include a first sun gear rotated by the first motor, one or more first planetary gears meshing with the first sun gear, and a first internal gear having internal teeth meshing with the first planetary gears and restricted from rotating. The second gear mechanism may include a second sun gear rotated by the second motor, one or more second planetary gears meshing with the second sun gear, and a second internal gear having internal teeth meshing with the second planetary gears and configured to rotate in accordance with revolution of the first planetary gears around the axis of the first sun gear. When the second planetary gears revolve around the axis of the second sun gear, the output section may rotate.

In the above-mentioned configuration, the rotation of the first internal gear may be restricted. When the first planetary gears meshing with the internal teeth of the first internal gear revolve, the second internal gear may rotate. Therefore, even if sticking occurs in one of the gear mechanisms and prohibits the planetary gears from rotating on the respective axes, the electric actuator can rotate the output section continuously with almost no time lag. As a result, the electric actuator provides a high reliability.

The first planetary gears may mesh with the internal teeth of the first internal gear restricted from rotating. Therefore, when the first planetary gears are unable to rotate on the respective axes due to sticking, the first planetary gears cannot revolve around the axis of the first sun gear. As a result, the second internal gear may also not rotate. On the other hand, the second planetary gears free from sticking may be allowed to revolve around the axis of the second sun gear; therefore, the output section can be rotated continuously in accordance with revolution of the second planetary gears. That is, even immediately after sticking has occurred in the first planetary gears, the output section can rotate continuously without being hindered by the sticking in the first planetary gears and with almost no time lag.

When the second planetary gears are unable to rotate on the respective axes due to sticking, the plurality of second planetary gears cannot revolve around the axis of the second sun gear while rotating on the respective axes. However, the second planetary gears can revolve around the axis of the second sun gear along with the second internal gear without changing the meshing position with the second sun gear and the meshing position with the second internal gear. Therefore, the output section can continuously rotate in accordance with the revolution of the second planetary gears. That is, even immediately after sticking has occurred in the second planetary gears, the output section can rotate continuously without being hindered by the sticking in the second planetary gears and with almost no time lag.

During normal operation in which no sticking occurs in any of the gear mechanisms, the power provided by the first motor may be transmitted sequentially to the first sun gear, the first planetary gears, and the second internal gear. As a result, the second internal gear can rotate. The second planetary gears meshing with the internal teeth of the second internal gear may revolve around the axis of the second sun gear along with the second internal gear in accordance with the rotation of the second internal gear. On the other hand, the power provided by the second motor may be transmitted sequentially to the second sun gear and the second planetary gears. As a result, the second planetary gears can rotate on the respective axes and also revolve around the axis of the second sun gear. That is, the second planetary gears can rotate at a rotation speed produced by adding together the revolution speed in accordance with the rotation of the second internal gear by the first motor and the revolution speed by the second motor (a rotation speed produced by so-called speed summing). The output section that rotates in accordance with the revolution of the second planetary gears may rotate at a rotation speed produced by speed summing; therefore, the output section can operate at a higher speed than in the conventional art without speed summing.

A failure detection mechanism for an electric actuator and an electric actuator according to an aspect of the above embodiment comprise: a first motor; a first gear mechanism connected to the first motor and connected to a driven member; a second motor; a second gear mechanism connected to the second motor and connected to the driven member; a first sensor configured to sense a value of electric current driving the first motor or a value associated with the value of the electric current driving the first motor; a second sensor configured to sense a value of electric current driving the second motor or a value associated with the value of the electric current driving the second motor; and a comparator configured to determine a failure based on a result of comparison between the value sensed by the first sensor and the value sensed by the second sensor.

What is claimed is:

1. A failure detection device for an electric actuator comprising:
    a first motor;
    a first gear mechanism connected to the first motor;
    a second motor;
    a second gear mechanism connected to the second motor;
    an output section capable of rotating at a speed produced by adding together a rotation speed based on the first gear mechanism and a rotation speed based on the second gear mechanism; and
    a first sensor configured to sense a value of electric current driving the first motor or a value associated with the value of the electric current driving the first motor;
    a second sensor configured to sense a value of electric current driving the second motor or a value associated with the value of the electric current driving the second motor; and
    a comparator configured to determine a failure based on a result of comparison between the value sensed by the first sensor and the value sensed by the second sensor.

2. The failure detection device according to claim 1, wherein the comparator is configured to determine a failure based on a periodic fluctuation in at least one of the value sensed by the first sensor and the value sensed by the second sensor.

3. The failure detection device according to claim 1, wherein the comparator is configured such that when there is constantly a deviation from a criterion in at least one of the value sensed by the first sensor and the value sensed by the second sensor, the comparator determines that there is a failure.

4. The failure detection device for an electric actuator according to claim 1,
    wherein the first gear mechanism includes a first sun gear rotated by the first motor, one or more first planetary gears meshing with the first sun gear, and a first internal gear having internal teeth meshing with the first planetary gears and restricted from rotating,
    the second gear mechanism includes a second sun gear rotated by the second motor, one or more second planetary gears meshing with the second sun gear, and a second internal gear having internal teeth meshing with the second planetary gears and configured to rotate in accordance with revolution of the first planetary gears around an axis of the first sun gear, and the output section rotates in accordance with revolution of the second planetary gears around an axis of the second sun gear.

5. An electric actuator comprising:
a first motor;
a first gear mechanism connected to the first motor;
a second motor;
a second gear mechanism connected to the second motor;
an output section capable of rotating at a speed produced by adding together a rotation speed based on the first gear mechanism and a rotation speed based on the second gear mechanism; and
a failure detection mechanism comprising:
    a first sensor configured to sense a value of electric current driving the first motor or a value associated with the value of the electric current driving the first motor;
    a second sensor configured to sense a value of electric current driving the second motor or a value associated with the value of the electric current driving the second motor; and
    a comparator configured to determine a failure based on a result of comparison between the value sensed by the first sensor and the value sensed by the second sensor.

6. The electrical actuator according to claim 5, wherein the comparator is configured to determine a failure based on a periodic fluctuation in at least one of the value sensed by the first sensor and the value sensed by the second sensor.

7. The electrical actuator according to claim 5, wherein the comparator is configured such that when there is constantly a deviation from a criterion in at least one of the value sensed by the first sensor and the value sensed by the second sensor, the comparator determines that there is a failure.

8. The electrical actuator according to claim 5, wherein:
the first gear mechanism includes a first sun gear rotated by the first motor, one or more first planetary gears meshing with the first sun gear, and a first internal gear having internal teeth meshing with the first planetary gears and restricted from rotating,
the second gear mechanism includes a second sun gear rotated by the second motor, one or more second planetary gears meshing with the second sun gear, and a second internal gear having internal teeth meshing with the second planetary gears and configured to rotate in accordance with revolution of the first planetary gears around an axis of the first sun gear, and
the output section rotates in accordance with revolution of the second planetary gears around an axis of the second sun gear.

9. A failure detection device for an electric actuator comprising (a) a first motor, (b) a first gear mechanism connected to the first motor, (c) a second motor, (d) a second gear mechanism connected to the second motor and (e) an output section capable of rotating at a speed produced by adding together a rotation speed based on the first gear mechanism and a rotation speed based on the second gear mechanism, the failure detection device comprising:
a first sensor configured to sense a value of electric current driving the first motor or a value associated with the value of the electric current driving the first motor;
a second sensor configured to sense a value of electric current driving the second motor or a value associated with the value of the electric current driving the second motor; and
a comparator configured to determine a failure based on a result of comparison between the value sensed by the first sensor and the value sensed by the second sensor.

10. A failure detection device for an electric actuator, comprising:
a first motor;
a first gear mechanism connected to the first motor and connected to a driven member;
a second motor;
a second gear mechanism connected to the second motor and connected to the driven member;
a first sensor configured to sense a value of electric current driving the first motor or a value associated with the value of the electric current driving the first motor;
a second sensor configured to sense a value of electric current driving the second motor or a value associated with the value of the electric current driving the second motor; and
a comparator configured to determine a failure based on a result of comparison between the value sensed by the first sensor and the value sensed by the second sensor.

* * * * *